United States Patent [19]
Palkovich et al.

[11] Patent Number: 5,551,243
[45] Date of Patent: Sep. 3, 1996

[54] SUPERCONDUCTIVE MAGNET FOR MAGNETIC RESONANCE SYSTEMS

[75] Inventors: Alex Palkovich, Oxford; John Bird, Oxon; Neil Clarke, Oxford, all of England

[73] Assignee: Elscint Ltd., Haifa, Israel

[21] Appl. No.: 501,513

[22] Filed: Jul. 12, 1995

Related U.S. Application Data

[63] Continuation of Ser. No. 214,138, Mar. 16, 1994, abandoned.

[30] Foreign Application Priority Data

Mar. 18, 1993 [GB] United Kingdom ............... 9305600

[51] Int. Cl.⁶ ................................................. F25B 19/00
[52] U.S. Cl. ..................... 62/51.1; 505/892; 505/894
[58] Field of Search ..................... 62/51.1, 47.1; 505/892, 894

[56] References Cited

U.S. PATENT DOCUMENTS

| | | | |
|---|---|---|---|
| 4,689,970 | 9/1987 | Ohguma et al. | 62/47.1 |
| 4,757,689 | 7/1988 | Bachler et al. | 417/901 |
| 5,032,772 | 7/1991 | Gully et al. | 62/6 |
| 5,157,928 | 10/1992 | Gaudet et al. | 62/55.5 |

FOREIGN PATENT DOCUMENTS 0416959  3/1991  European Pat. Off. ............... 62/51.1

*Primary Examiner*—Ronald C. Capossela
*Attorney, Agent, or Firm*—Greenblum & Bernstein P.L.C.

[57] ABSTRACT

A super conducting magnet system for magnetic resonance systems comprising at least one radiation shield. Temperature sensors, an external refrigeration system and a controller are provided for maintaining said at least one shield at a constant temperature by heating the shield and reducing the heat provided as the refrigerator system wears or by increasing the frequency of the refrigeration cycle as the system wears or both.

10 Claims, 4 Drawing Sheets

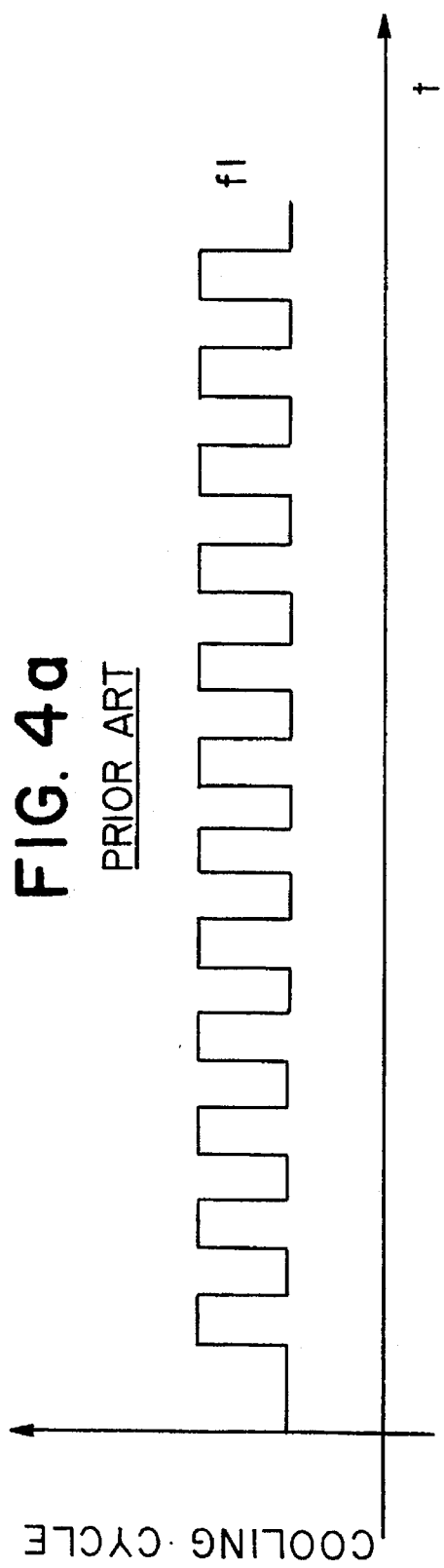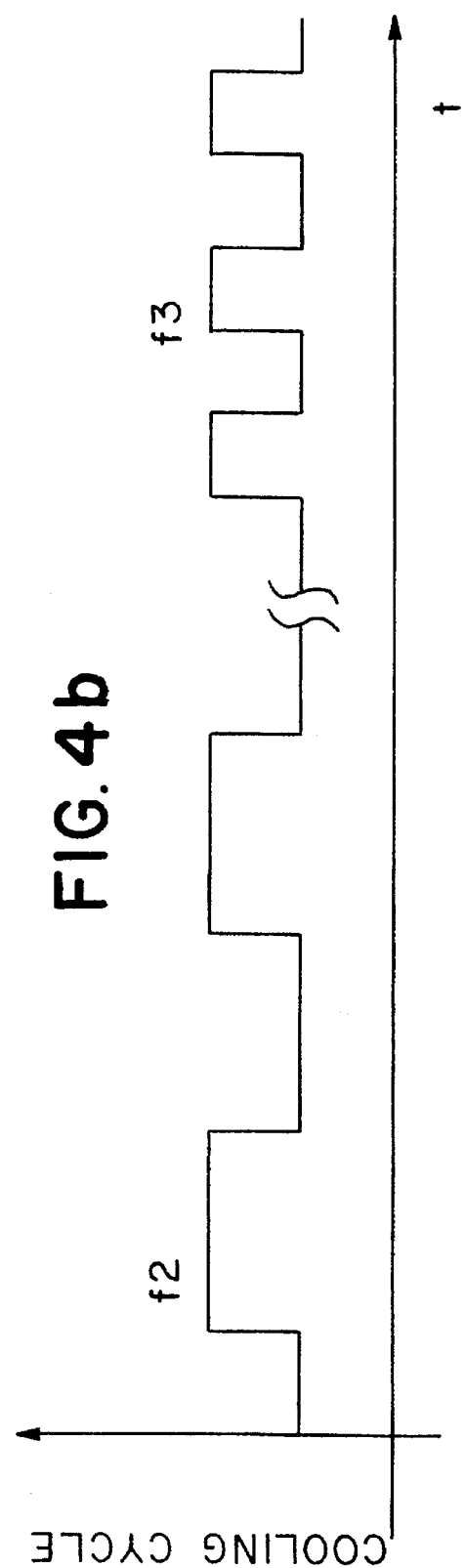

SUPERCONDUCTIVE MAGNET FOR MAGNETIC RESONANCE SYSTEMS

This application is a continuation of application Ser. No. 08/214,138, filed Mar. 16, 1994, now abandoned.

FIELD OF INVENTION

This invention is concerned with magnetic resonance (MR) diagnostic imaging devices and more particularly with cryogenic magnet systems for use in such devices.

BACKGROUND OF THE INVENTION

Super-conductive magnet systems are used in many of the presently available and proposed Magnetic Resonance Imaging (MRI) diagnostic devices. Typically these magnets consist of a super-conducting coil immersed in a bath of liquid helium to maintain a low temperature of 4.2 degrees K. One of the problems with liquid helium cooled systems is that low temperature is maintained by the "Boil-Off" of the liquid helium that occurs when it's temperature reaches 4.2 degrees K. Due to the "Boil-Off", the helium has to be replaced at frequent intervals. Thus costly and bothersome replacement of the helium is required after relatively short time periods.

To reduce the effects of heat at room temperature on the helium liquid the bath is enclosed by a vacuum chamber. To further reduce the heat typically one or more heat shields (usually two) are placed in the vacuum space such that they completely enclose the bath of liquid helium, and the bath, the heat shields and the vacuum chamber are kept concentric, but, without touching each other by various supports having low thermal conductivity. In the prior art, two heat shields were used, and they were cooled to further reduce liquid helium loss using low temperature refrigerator systems, operating on a Gifford McMahon cycle, Stirling cycle or other thermodynamic cycle. The steady state operating temperature of these shields was governed by the heat balance between the cooling power of the refrigerator device and the heat entering the shields by way of conduction and radiation.

In a well-designed MRI magnet a typical low temperature refrigerator can provide more cooling power than is required to reduce helium boil-off. This is because once the shield closest to the helium can is cooled below 20 degrees K, its further cooling is unnecessary. It is enough to make sure that the temperature of the shields does not rise above 20 degrees K. Cooling the temperature of the shields to 20 degrees K rather than to 10 degrees K surprisingly actually adds to the useful lifetime of the refrigerator. When the refrigerator is working at a low number of cycles per second with low cooling, the refrigerator's moving parts wear out at a slower rate; thus, the service interval of the refrigerator can be extended.

However there is a problem associated with radiation shields which is the appearance of eddy currents in the shields. These currents are set up by pulsed gradient magnetic fields during the image acquisition process. The gradient field is normally varied to compensate for these eddy currents and the magnetic field they create. However as the working parts of the refrigerator wear with time the refrigerator's cooling power decreases, and the shield temperature rises. As the temperature of the shield changes, it's electrical resistance changes; thus the size of the eddy current changes. This results in incorrect compensation, which causes a decrease in image quality. Therefore the refrigerator device will require servicing or the eddy current compensation will require recalibrating.

In both cases it will be necessary to put the MR system out of service and to use the time of a qualified person, thus causing a waste of money and time. In the prior art the use of an electric heater was suggested to maintain the constant temperature of the shields. The electric heater was attached to the shields. An example of such an apparatus can be found in EP-416-959-A. This solution while it does help to keep the temperature of the shields constant, has a number of disadvantages. One disadvantage of such a system is that it uses more cooling power from the refrigerator than necessary for cooling the radiation shields themselves; thus the parts of the refrigerator wear out faster, and need to be serviced sooner than if only the necessary cooling power was used. Another disadvantage of the above cited prior art is the need to add an electrical component (electric heater) to the shields themselves. This can adversely effect the homogeneity of the magnetic field of the MR system.

This invention is concerned with solving the above problems and others that are associated with the use of radiation shields in MR systems.

BRIEF DESCRIPTION OF THE INVENTION

According to the present invention, an improved cryogenic magnet system for use in MRI diagnostic devices is provided, said system comprising: an electromagnet immersed in a tank containing a liquefied gas, said tank located in a vacuumed container that is vacuumed to high vacuum temperature control means for maintaining a constant temperature on said at least one radiation shield, said temperature control means including means for maintaining a constant cooling power from said refrigeration system and temperature sensors on said at least one radiation shield (hereinafter sometimes referred to as "shields").

Keeping the temperature of the shields constant prevents undue changes in eddy currents. Failure to keep the temperature of the shields constant is indicative of a failure of the refrigerator's cooling system or the eddy current compensation system.

The cooling power of the low temperature refrigerator is governed by the thermodynamic efficiency with which it performs it's cooling cycle and the frequency with which the cycle is repeated. Since refrigeration systems, usually have more cooling power then necessary for cooling the radiation shields, it is possible to initially work the refrigeration system at a low cycle frequency, thus not using the whole extent of the cooling systems capability. As the cooling power of the refrigerator decreases the frequency of the cooling cycle will be increased, thus maintaining a constant cooling power from the refrigerator and keeping a constant temperature on the shields. In this case the optimal temperature will be the highest temperature that will not increase the boil-off of the liquefied gas. At this temperature the wear on moving parts will be the least and the time at which a constant temperature can be maintained with no need for servicing the system will be the longest. In one embodiment the invention includes controlling the cooling power of the refrigeration system directly.

In another embodiment controlling the cooling power of the refrigerator is done via a feed-back loop using temperature sensors which are mounted on the shields. The control is achieved by varying the frequency of the cooling cycle in response to the temperature reading from the radiation shields.

BRIEF DESCRIPTION OF THE DRAWINGS

The above described and other subjects and features of the present invention will be best understood when considered in the light of the following description made in conjunction with the accompanying drawings; wherein:

FIG. 4 is a diagram showing the changes in the operating cycle of the refrigeration system in the present invention.

GENERAL DESCRIPTION

Figure 1:
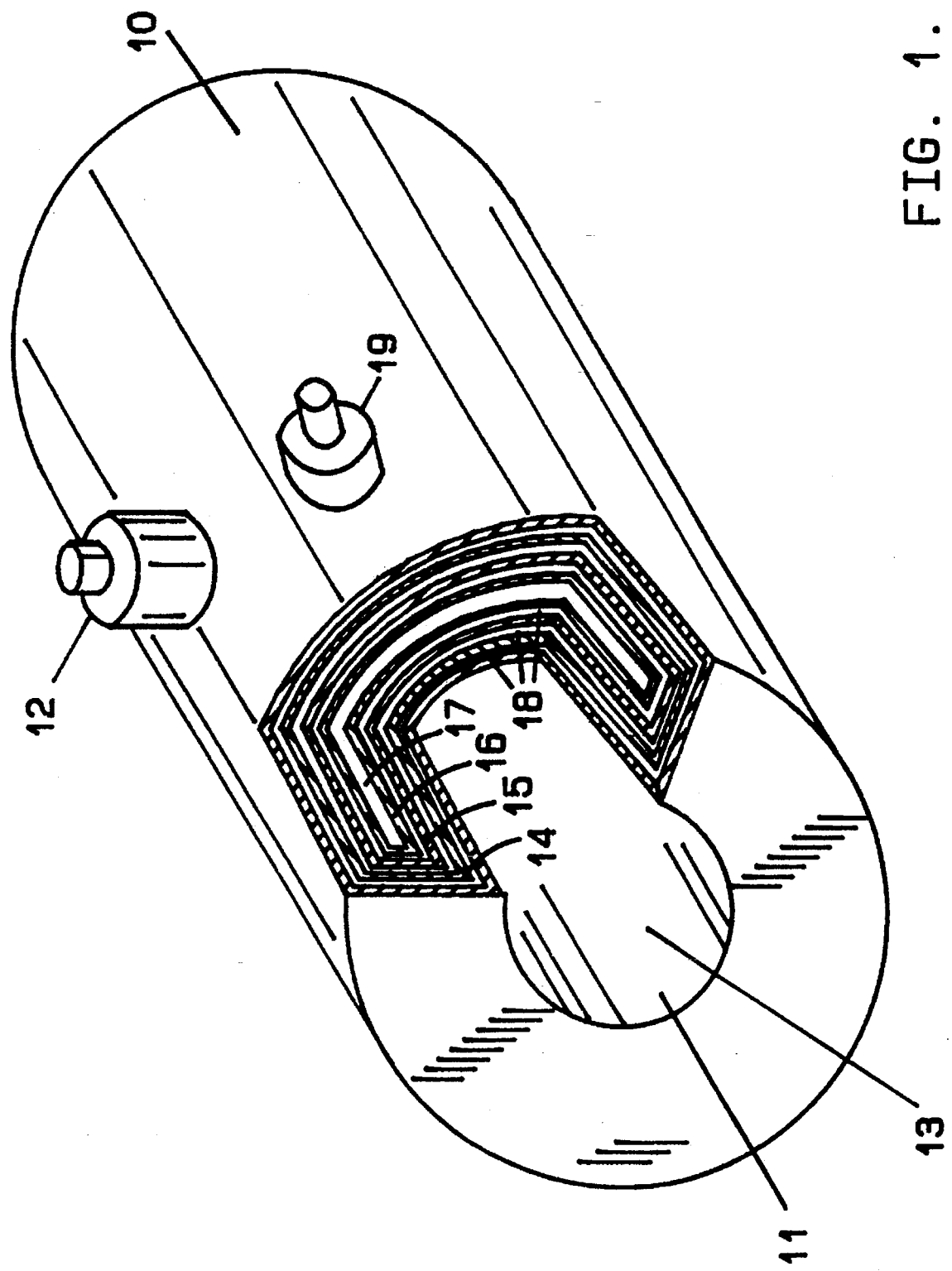
FIG. 1 is a typical layout of a superconducting MRI magnet.

FIG. 1 shows a typical superconducting MRI magnet 10. The magnet system comprises a vacuum chamber 11. From the vacuum chamber a liquid helium gas vent also used as the liquid helium refill and energizing port 12 is provided. The patient or subject is placed into the patient bore 13. The superconducting magnet coil 17 is immersed in a liquid vessel 16, which is usually filled with helium. The liquid vessel is surrounded with a vacuum chamber 18, which is ideally enclosed by two radiation shields 14 and 15. Means for cooling said radiation shields are provided by an external refrigeration system which is connected to port 19.

Figure 2:
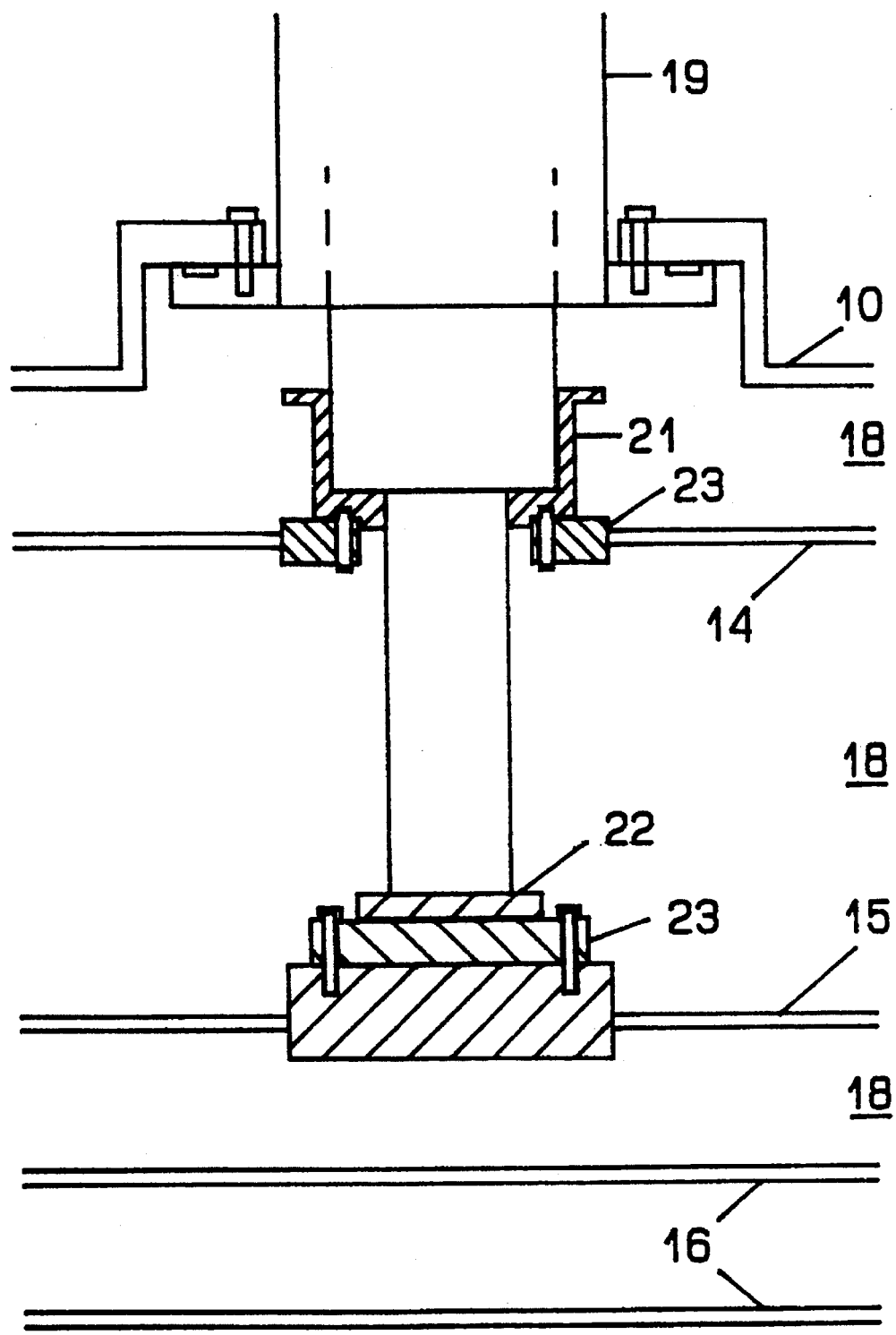
FIG. 2 is a typical embodiment of prior art magnet showing the connection between the refrigeration device and the shields.

FIG. 2 shows a typical embodiment known from prior art, of a connection between port 19 for the external refrigerator 20 and the shields 14 and 15. The refrigeration system is connected to the shields with flexible thermally conducting links 23, thus creating two cooling stages 21 and 22.

Figure 3:
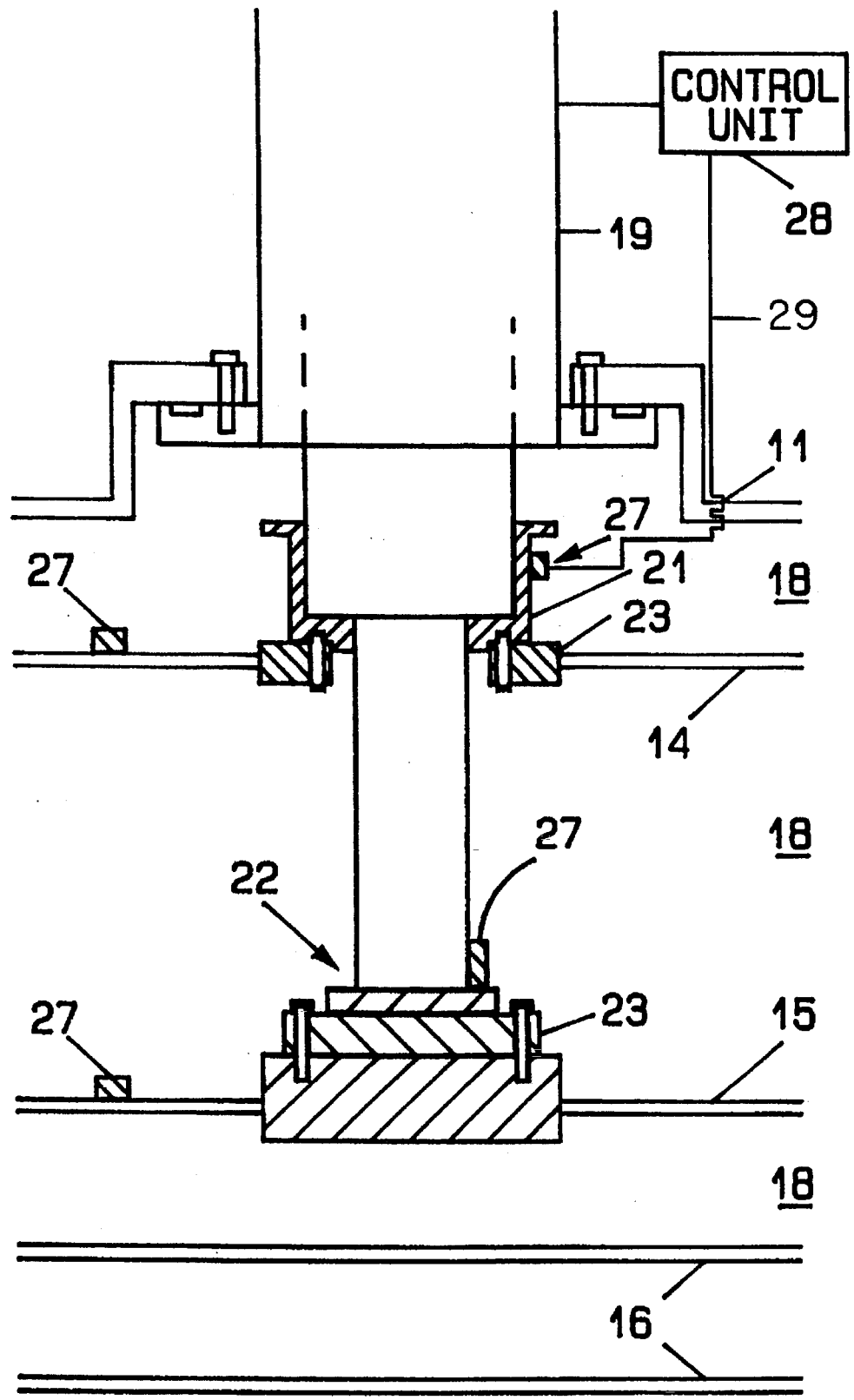
FIG. 3 is one embodiment of the present invention.

FIG. 3 is an example of one embodiment of the present invention. This embodiment is used for maintaining a constant and optimal temperature of the shields. Temperature sensors 27 are mounted on the shields 14 and 15 in order to detect any temperature changes caused by the decrease in the cooling power of the refrigeration systems as it's parts wear out. When a shield temperature increase is detected by said temperature sensors 27 a signal is sent via 29 to control unit 28; thus, the cooling power of the refrigerator is increased so as to maintain a constant temperature of said radiation shields. The cooling temperature is increased by increasing the frequency with which the refrigeration cycle is repeated with the use of control unit 28. This results in a constant temperature which can be maintained as long as it is still possible to increase the frequency with which the cooling cycle is repeated in the same amount as the cooling power of the refrigerator decreases. Eventually the moving parts of the refrigerator will have to be serviced; i.e., when it's performance can no longer be compensated for by an increase of frequency or/and a recalibration of eddy current compensation. But this necessity for servicing can be delayed with the present invention. FIG. 4a shows the cooling cycle of a refrigeration system for an MR system in prior art. The frequency in which the cooling system works is a constant frequency f1. FIG. 4b shows the cooling cycle in the present invention. The cooling cycle begins with a slow frequency f2 (f1>f2). In time the parts of the refrigerator wear out and as a result it's cooling power decreases. This causes the temperature on the shields to increase as well. In order to restore the original temperature on said shields the cooling frequency of the refrigeration system is increased to f3 (f3>f2) so as to maintain the constant temperature of the shields. Thus cooling power of the system remains constant.

While the invention has been described with reference to a preferred embodiment, it should be understood that this embodiment is exemplary only and is not meant to act as a limitation on the scope of the invention.

What is claimed is the following:

1. An improved cryogenic superconductive magnet system for use in magnetic resonance (MR) devices, said system comprising:

(a) a cryogenic superconducting electro-magnet immersed in a first tank containing a first liquified gas;

(b) said first tank being mounted in a vacuum container;

(c) at least one heat radiation shield surrounding said first tank in said vacuum container;

(d) a refrigerator system external to said vacuum container thermally coupled to said at least one heat radiation shield for cooling said heat radiation shield;

(e) temperature control means for maintaining a constant temperature on said at least one heat radiation shield; and (f) said temperature control means including means for maintaining a constant cooling power from said refrigeration system by varying the frequency of the refrigeration system cycle.

2. The system of claim 1 wherein said means for maintaining a constant temperature on said at least one heat radiation shield includes temperature sensors which are mounted on said radiation heat shields.

3. The system of claim 2 wherein said means for maintaining a constant temperature includes means for controlling the cooling power of said refrigeration system via a feedback loop including the temperature sensors, a control unit and the refrigeration system.

4. The system of claim 3 wherein said constant temperature is the highest temperature which will still enable preventing the boil-off said first liquefied gas.

5. The system of claim 3 wherein said constant temperature is 20K.

6. A method for controlling the temperature of at least one heat shield in a cryogenic magnetic resonance (MR) superconducting system to maintain a constant temperature on said at least one heat shield, in order to improve the image quality and delay the need for repairing a refrigeration system in said cryogenic superconducting MR system using the at least one heat shield, the method includes:

thermo-conductively coupling said refrigeration system to said at least one heat shield, maintaining a constant temperature on said at least one heat shield by maintaining constant cooling power from said refrigeration system coupled to said at least one heat shield, said step of maintaining a constant temperature including:

using a feedback loop comprising the refrigerator system, temperature sensors mounted on said at least one heat shield and a control unit for varying the frequency of operation of the refrigerator system's cooling cycle.

7. The method of claim 6 wherein said constant temperature is the highest temperature which will not increase the boil-off of said first liquified gas.

8. The method of claim 6 wherein said constant temperature is less than original to 20 degrees K.

9. The method of claim 6 wherein said controlling methods also include the step of controlling the cooling power of the refrigerator system, by varying the frequency with which the cooling cycle occurs, so when cooling of said refrigeration means decreases, the cooling cycle is increased in order to maintain a constant optimum temperature of said shields, said temperature being the optimum temperature which will not increase the boil-off of said liquefied gas, while delaying the need for refrigeration service and delaying problems connected with eddy current.

10. An improved cryogenic superconductive magnet system for use in magnetic resonance (MR) devices, said system comprising:

(a) a cryogenic superconducting electromagnet immersed in a first tank containing a first liquified gas;

(b) said first tank being mounted in a vacuum container;

(c) at least one heat radiation shield surrounding said first tank in said vacuum container;

(d) a refrigerator system external to said vacuum container thermo-conductively coupled to said at least one heat radiation shield;

(e) a temperature control system for maintaining a constant temperature on said at least one heat radiation shield; and (f) said temperature control system including temperature sensors which are mounted on said at least one heat radiation shield and a control unit for maintaining a constant cooling power from said refrigeration system by changing the frequency of the refrigeration system operating cycle as a function of changes in temperature of the at least one heat radiation shield determined by said temperature sensors.

* * * * *